United States Patent
Duan et al.

(10) Patent No.: US 6,795,623 B2
(45) Date of Patent: Sep. 21, 2004

(54) OPTICAL CAVITY RESONATING OVER A CONTINUOUS RANGE OF FREQUENCIES

(75) Inventors: Guang-Hua Duan, Chatenay Malabry (FR); Hakon Helmers, Sceaux (FR); Arnaud Leroy, Paris (FR); Joël Jacquet, Limours (FR)

(73) Assignee: Avanex Corporation, Fremont, CA (US)

( * ) Notice: Subject to any disclaimer, the term of this patent is extended or adjusted under 35 U.S.C. 154(b) by 158 days.

(21) Appl. No.: 10/265,618

(22) Filed: Oct. 8, 2002

(65) Prior Publication Data

US 2003/0081639 A1 May 1, 2003

(30) Foreign Application Priority Data

Oct. 15, 2001 (FR) ............................................. 01 13261

(51) Int. Cl.[7] ................................................. G02B 6/26
(52) U.S. Cl. ............................. 385/50; 385/49; 385/37; 372/102; 372/105
(58) Field of Search .............................. 385/37, 39, 49, 385/50; 372/19, 20, 32, 102, 105

(56) References Cited

U.S. PATENT DOCUMENTS

| | | | |
|---|---|---|---|
| 4,873,691 A | * | 10/1989 | Uomi et al. .................... 372/20 |
| 5,870,417 A | * | 2/1999 | Verdiell et al. ................ 372/32 |
| 6,088,373 A | | 7/2000 | Hakki |
| 6,091,755 A | * | 7/2000 | Sanders et al. ................ 372/92 |
| 6,263,002 B1 | * | 7/2001 | Hsu et al. ........................ 372/6 |
| 6,525,872 B1 | * | 2/2003 | Ziari et al. ................ 359/341.3 |
| 6,574,262 B1 | * | 6/2003 | Dautremont-Smith et al. ........................... 372/102 |
| 6,625,182 B1 | * | 9/2003 | Kuksenkov et al. .......... 372/19 |

FOREIGN PATENT DOCUMENTS

EP 1 133 036 A2 9/2001

OTHER PUBLICATIONS

Morton P A: "Mode–Locked Hybrid Solition Pulse Source with Extremely Wide Operating Frequency Range" IEEE Photonics Technology Letters, IEEE Inc. New York, US, vol. 5, mo. 1, 1993, pp. 28–31, XP000335389.

Schrans T el al: "Tunable Active Chirped–Corrugation Waveguide Filters" Applied Physics Letters. American Institute of Physics. New York, US, vol. 55, No. 3, Jul. 17, 1989, pp. 212–214, XP000046573.

Li Shenping et al: "Wavelength–tunable picosecond pulses generated from stable self–seeded gain–switched laser diode with linearly chirped fibre Bragg grating" Electronics Letters, IEEE Stevenage, GB, vol. 34, No. 12, Jun. 11, 1998, pp. 1234–1236, XP006009866.

\* cited by examiner

Primary Examiner—Ellen E. Kim
(74) Attorney, Agent, or Firm—Moser, Patterson & Sheridan, L.L.

(57) ABSTRACT

An optical resonant cavity (50) defined between two mirrors (13', 40), one of which (40) is a variable pitch Bragg reflector grating, is characterized in that a parameter $C_S$ of variation of the Bragg wavelength of the grating is such that the cavity resonates continuously from a first optical frequency to a second optical frequency higher than the first optical frequency. The invention can be used in particular to produce broadband band-pass filters with steep flanks, broadband amplifiers with no gain fluctuation, and continuous emission spectrum lasers and light-emitting diodes.

15 Claims, 3 Drawing Sheets

OPTICAL CAVITY RESONATING OVER A CONTINUOUS RANGE OF FREQUENCIES

TECHNICAL FIELD

The field of the invention is that of optical cavities, in particular laser optical cavities.

PRIOR ART

Fabry-Pérot optical resonant cavities are defined longitudinally by first and second reflectors. All optical wavelengths for which the dimension of the cavity is equal to an integer number of half-wavelengths correspond to resonant modes of the cavity. Thus for a given dimension of the cavity there is an infinite number of wavelengths producing resonant modes. One prior art Fabry-Pérot cavity is made up of two mirrors. In another prior art cavity one of the reflectors is a Bragg reflector grating etched on a waveguide, for example a fibre. That kind of cavity has a plurality of resonant modes that correspond to wavelength values close to Bragg values for which there is a reflection peak of the reflector.

Both the above cavities have the common feature that the cavity resonates at discrete wavelength values.

A small number of non-resonant structures, such as light-emitting diodes and travelling wave amplifiers, generate continuous spectra. In structures of that kind the gain of the amplifier is subject to unwanted fluctuations, and if the unwanted fluctuations are eliminated, the gain becomes that of a single-pass travelling wave amplifier.

BRIEF DESCRIPTION OF THE INVENTION

Resonant structures provide higher transmission coefficients than can be obtained with non-resonant structures, but are inherently highly sensitive to small variations of the wavelength (or optical frequency) of the transmitted light.

The invention therefore proposes a resonant cavity having a high transmission coefficient and a constant spectral response over a continuous range from a minimum frequency value to a maximum frequency value. This continuous range of frequencies corresponds to a continuous range of wavelengths between a maximum first value corresponding to the minimum frequency of the continuous range of frequencies and a minimum second value corresponding to the maximum frequency of the continuous range of frequencies. This is known in the art.

To the above ends, the invention provides a resonant optical cavity having a first part provided with a first waveguide oriented along a longitudinal axis on which an origin of distances is defined, the cavity being defined between first and second reflectors, the second of the reflectors being a variable pitch Bragg reflector grating on said first waveguide, said grating of the second reflector having one end near the first reflector and one end farther away from the first reflector, a parameter $C_S$ of variation of the Bragg wavelength defined as the derivative at a point on the reflector grating of the Bragg wavelength $\lambda_B$ at that point with respect to the distance between that point and the origin having a given value, which cavity is characterized in that said value of the parameter $C_S$ and the position of said grating relative to the origin are such that the cavity formed between said first reflector and said second reflector resonates continuously from a first optical frequency to a second optical frequency higher than the first optical frequency.

BRIEF DESCRIPTION OF THE DRAWINGS

Embodiments of the invention are described next with reference to the accompanying drawings, in which.

Components having the same function as components already commented on with reference to one figure and carrying the same reference number are not necessarily commented on again in connection with another figure.

BRIEF DESCRIPTION OF EMBODIMENTS

Figure 1:
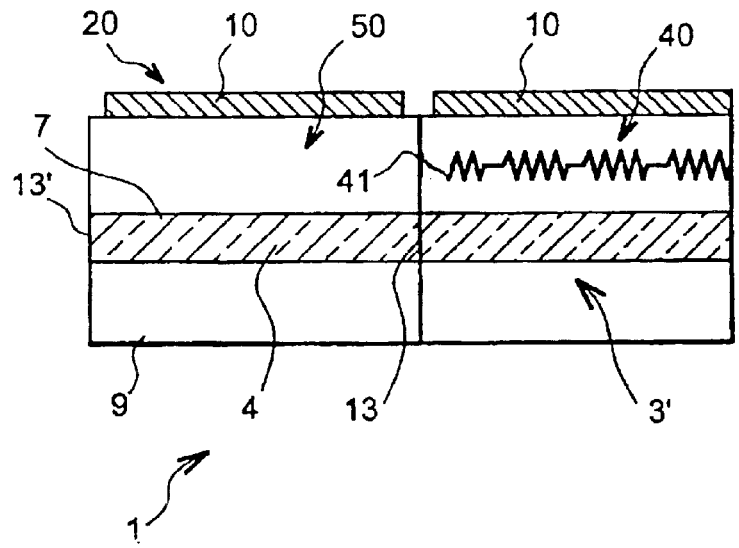
FIG. 1 is a diagram showing a first embodiment of the invention.

FIG. 1 is a diagram showing a first embodiment of the invention.

It shows an active portion 20 having the structure of a semiconductor laser, for example a surface or buried stripe laser structure. The active portion 20 is formed on a semiconductor substrate 9 and includes a waveguide with a semiconductor layer 4 for selectively activating the amplifier function of the waveguide. This is known in the art. The semiconductor layer 4 is disposed between electrical and optical confinement layers that are not identified by reference numbers in the figures. This is also known in the art. A metal, for example AuPt, contact layer 10 on top of the confinement layers constitutes a top electrode which cooperates with a bottom electrode, not shown. A rear face 13' of the active portion 20 is cleaved or treated to have a high coefficient of reflection.

As shown in FIG. 1, a passive integrated waveguide 3' is longitudinally aligned with the semiconductor layer 4. The waveguide 3' is optically coupled to the waveguide of the active portion 20. A Bragg reflector 40 is etched onto the waveguide 3'.

Thus a Fabry-Pérot cavity 50 with two coupled parts is formed. A first part of the cavity is the part that includes the waveguide 3'. A second part 7 is the part that includes the active portion 20.

The reflective rear face 13' and the Bragg reflector 40 constitute facing first and second reflectors defining the resonant cavity 50.

Thus in the embodiment described above the cavity 50 includes, in addition to the first part provided with the first waveguide 3', another part 7 consisting of a semiconductor waveguide optically aligned with said first part and optically coupled to the first waveguide.

The production of the Bragg reflector grating 40 is described next.

The centre Bragg wavelength $\lambda_B$ at a point on the periodic Bragg grating to be written on the waveguide 3' is a function of the pitch $\Lambda$ of the grating and the index n of the waveguide, in accordance with the following equation:

$$\lambda_B(L_B)=2n\Lambda(L_B) \quad (1)$$

In the above equation, $L_B$ is the distance between the start of the grating, i.e. the end 41 of the grating nearest the active portion 20, and the point at which the centre wavelength $\lambda_B$ of the grating is evaluated, i.e. where a wave having this wavelength (in a vacuum) undergoes reflection. The above equation (1) expresses the fact that the centre wavelength $\lambda_B$ is not constant, and is a function of the distance $L_B$. In this case the term "chirped Bragg reflector" is used.

If the chosen function is a linear function, then the reflector is called a "linearly chirped reflector". An increase $\Delta L_B$ in the distance $L_B$ is then proportional to a corresponding increase $\Delta \lambda_B$ in the centre Bragg wavelength $\lambda_B$ of the grating at the point concerned. Thus $\Delta \lambda_B / \Delta L_B = C_S$, where $C_S$ is a constant called the Bragg wavelength fluctuation parameter of the Bragg grating (also known as the grating chirp parameter).

For example, the value of $C_S$ can be from 0.1 nm/cm for a grating etched on an optical fibre to 100 nm/cm for an InP integrated waveguide formed lithographically by an electron beam, as described in the paper [1] listed in the appendix to the present description.

For light at a wavelength $\lambda$ in a vacuum, the condition for resonance of the two-part cavity 50 is given by the following equation:

$$n_a L_a + n_B L_B(\lambda) = m\lambda/2 \quad (2)$$

In the above equation:

$n_a$ is the refractive index of the part 7 of the cavity,
$L_a$ is the length of said part 7 of the cavity,
$n_a L_a$ is therefore the optical length of said second part of the cavity,
$n_B$ is the refractive index of the part 3' of the cavity, i.e. that of the waveguide with the Bragg grating,
$L_B$ is, as already explained, the distance between the point on the Bragg grating at which $\lambda_B$ is evaluated and the start of the waveguide, and
$n_B L_B$ is therefore the optical length of said first part of the cavity.

Equation (2) expresses the fact that the optical length of the two-part cavity 50 is equal to an integer number $\underline{m}$ of half-wavelengths of value $\lambda$.

If it is assumed that equation (2) is satisfied for a minimum Bragg wavelength $\lambda_B$ corresponding to the second frequency, for example, which is the highest frequency of the continuous range, and if it is required also to be satisfied for all wavelength value increases $\Delta\lambda$ from the minimum wavelength $\lambda_a$ to a maximum wavelength $\lambda_b$ corresponding to the first (minimum) frequency, for example, then the following equations must be satisfied simultaneously:

$$n_a L_a + n_B L_B(\lambda_a) = m\lambda_a/2 \quad (2),$$

and $$n_a L_a + n_B L_B(\lambda_a + \Delta\lambda) = m(\lambda_a + \Delta\lambda)/2 \quad (3)$$

For fibres with linear variation Bragg reflectors used to compensate phase dispersion, a wave having a given wavelength (in a vacuum) is reflected at the place on the reflector grating where said wavelength is equal to the Bragg wavelength. This is known in the art. If this is assumed to apply generally, the optical length of the cavity is a linear function of the wavelength of the wave. This is reflected in the following equation:

$$L_B(\lambda_a + \Delta\lambda) = L_B(\lambda_a) + \Delta\lambda dL_B/d\lambda \quad (4)$$

From equations (2), (3) and (4):

$$C_S d\lambda_B/dL_B = n_B\lambda_a/[n_a L_a + n_B L_1] \quad (5)$$

In this equation, $L_1$ is the distance between the end 41 of the Bragg grating 40 and the front face 13 of the second part 7.

This equation expresses the fact that, in the case of a linear relation between $\lambda_B$ and $L_B$, the derivative of $\lambda_B$ with respect to $L_B$ at a point of the waveguide including the grating, i.e. the value of the parameter $C_S$, is equal to the quotient of the optical wavelength $n_B\lambda_a$ in the first waveguide 3' that corresponds to the minimum wavelength of the range (or the second frequency value of the range) divided by the optical distance between the first reflector 13' and the end 41 of the grating 40 nearest the first reflector 13'.

Accordingly, the required value of the parameter $C_S$ is a function of the position of the grating along a longitudinal axis of the waveguide 3'.

Figure 2:
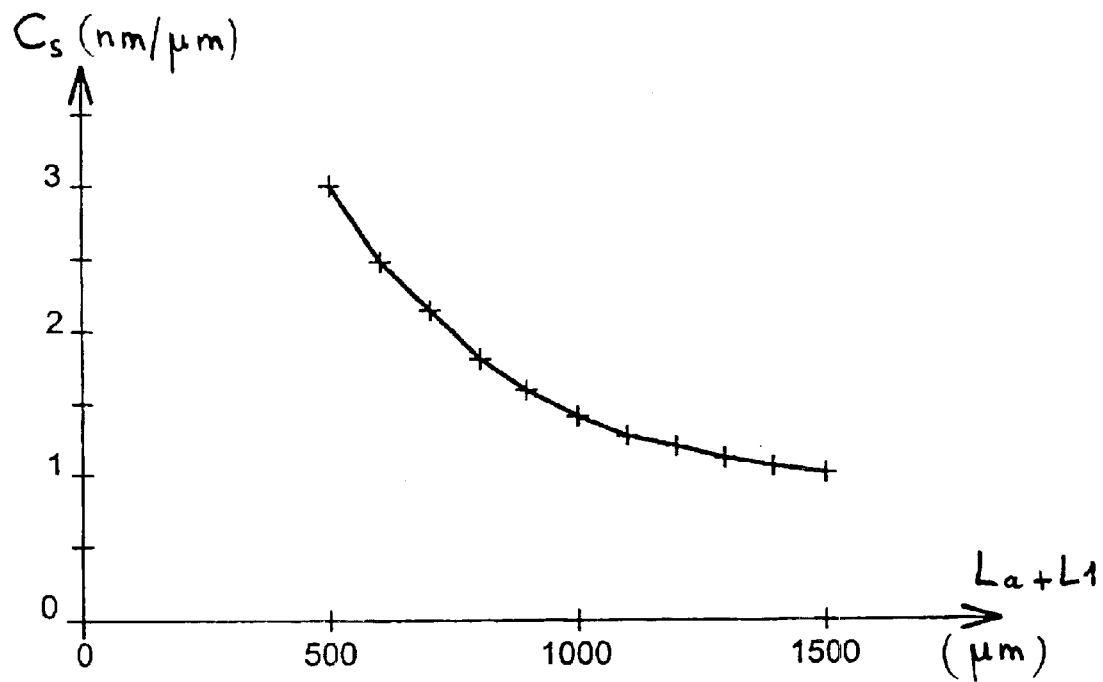
FIG. 2 shows a curve which shows the value that the parameter $C_S$ must have as a function of the distance between the rear face of an active waveguide and the end of a Bragg grating nearest that face.

FIG. 2 shows a curve which shows the required value of the parameter $C_S$ as a function of the distance between the rear face 13' of the second (active) part 7 and the end 41 of the grating 40, to obtain a continuous variation of wavelength between a minimum value and a maximum value or, which amounts to the same thing, between a maximum optical frequency and a minimum optical frequency. The value of the parameter $C_S$ is plotted on the ordinate axis and is expressed in nanometres per micrometre (nm/μm). $C_S$ is a function of the sum of the length $L_a$ of the active portion and the distance $L_1$ between the front face 13 of the active layer 4 and the end 41 of the grating 40 nearest the front face 13. The sum of the distances $L_a + L_1$ is plotted on the abscissa axis and expressed in micrometers. To plot this curve, the refractive index values of the two parts are assumed to be equal to each other and to have a value of around 3.45. The length $L_a$ is 500 μm. The value of $C_S$ is from 3 nm/μm to 1 nm/μm and the sum of the distances is from 500 μm to 1 500 μm.

Above-cited document [1] indicates that a lithographic process using an electron beam is the perfect way to produce the above kind of variable pitch grating. The variation of $C_S$ as a function of distance is not linear. An embodiment satisfying the conditions on the values of $C_S$ shown in FIG. 2 provides continuous variation of wavelength from a minimum first value to a maximum second value with a difference between them of 20 to 30 nanometres, for example.

Figure 3:
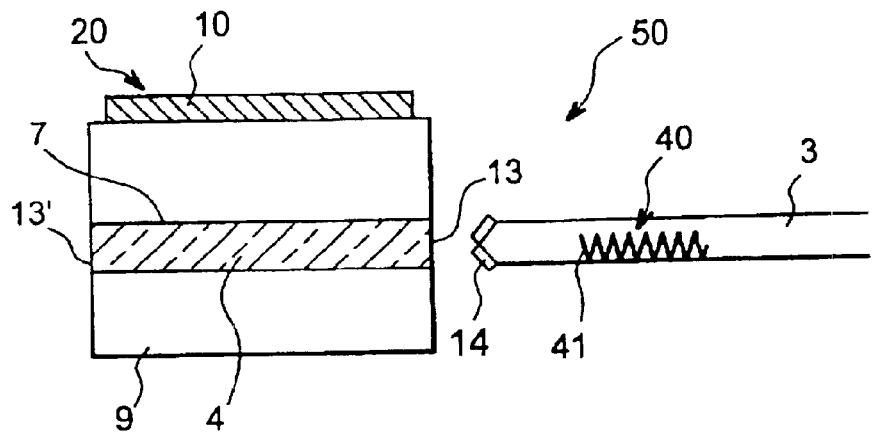
FIG. 3 is a diagram showing a second embodiment of the invention in which a Bragg grating is written in an optical fibre.

A second configuration of the invention is described next with reference to FIG. 3.

This second configuration differs from that described with reference to FIG. 1 essentially in that the waveguide 3' is formed by an optical fibre 3 coupled optically, for example by a lens 14, to the second part 7 (including the active portion 20). A front face 13 of the part 7 is treated to have the lowest possible coefficient of reflection, if possible a zero coefficient of reflection. As a result of this the part 7 forms with the fibre 3 a single Fabry-Pérot optical cavity 50 extending from a first reflector formed by the highly reflective rear face 13' of the second part 7 to the point of reflection on the second reflector formed by the Bragg reflector grating 40. The theory of operation of the cavity is the same as that described above.

Figure 4:
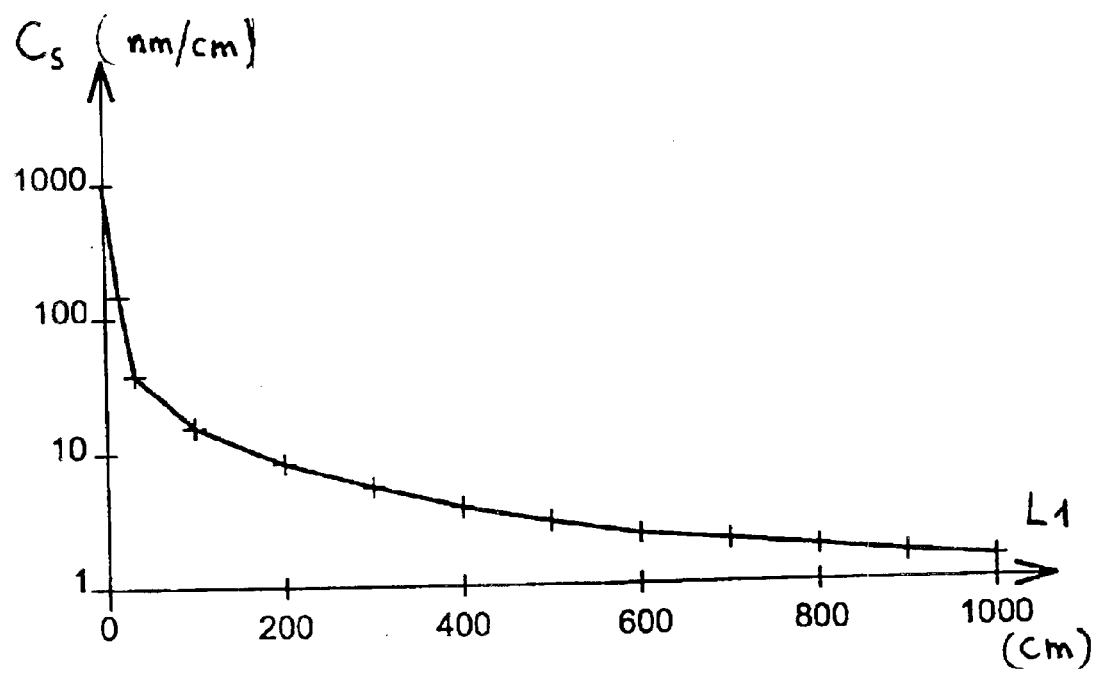
FIG. 4 shows a curve that shows the value that the parameter $C_S$ must have, in the FIG. 3 embodiment, as a function of the length of fibre with no grating between the front face of an active waveguide and the start of the Bragg grating.

FIG. 4 shows a curve of the required value of the parameter $C_S$ as a function of the distance between the front face 13 and the end 41 of the grating 40 nearest the front face 13. The value of the parameter $C_S$ is plotted on the ordinate axis and expressed in nanometres per centimetre. The distance between the front face 13 and the end 41 of the grating 40 is plotted on the abscissa axis and expressed in centimetres. The curve is plotted for refractive index values $n_a$ in the layer 4 and $n_B$ in the fibre of 1.45 and 3.45, respectively. As in the previous example, the distance $L_a$ is 500 µm.

The curve shows that $C_S$ falls from 1 000 nm/cm to about 1.5 nm/cm when the distance between the front face 13 and the end 41 of the grating 40 increases from 0 to 10 metres. This remains within the range of values that can be obtained on a fibre.

Figure 5:
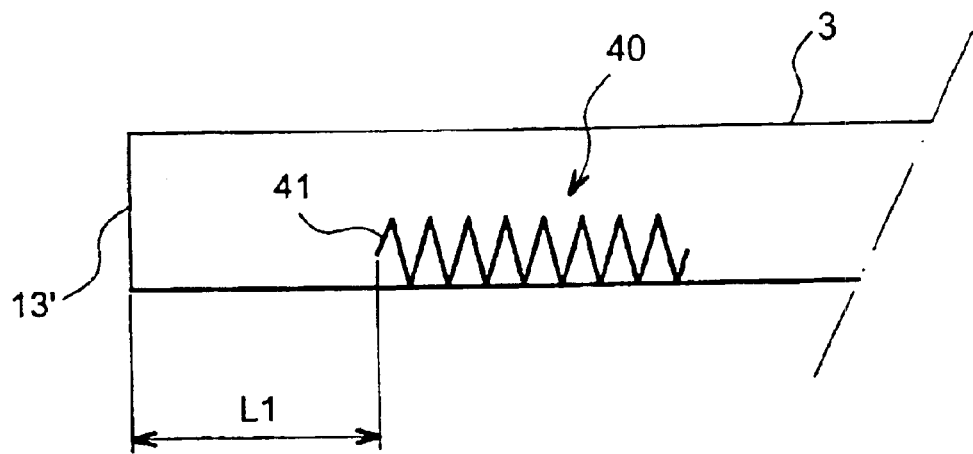
FIG. 5 shows a third embodiment of the invention.

A third configuration of the invention is described next with reference to FIG. 5. In this embodiment the Fabry-Pérot cavity resonates continuously and is formed entirely within an InP waveguide, for example, or a fibre 3, as shown in FIG. 5. One end 13' of the fibre has a highly reflective coating and the fibre incorporates a Bragg reflector grating 40 having a Bragg wavelength variation parameter $C_S$. The grating 40 has one end 41 at a distance $L_1$ from the reflective coating 13'. The end 41 is that nearest the reflector 13'. The grating 40 is extended beyond the distance $L_1$. The required value of the parameter $C_S$ is a continuous function of the distance between the rear face 13' and the end 41 of said Bragg grating nearest that face. In this embodiment the first reflector 13' is on the first waveguide 3 that carries the Bragg reflector grating 40 forming the second reflector. The reflective coating 13' can naturally be replaced by a second Bragg reflector grating 40', not shown in FIG. 5, on the waveguide 3 forming the second reflector 40.

The operation of this embodiment is analogous to that previously described.

Figure 6:
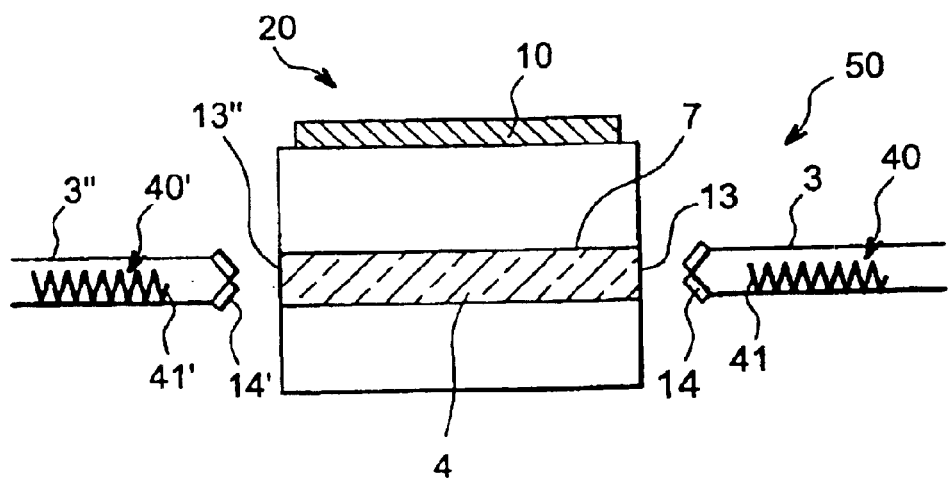
FIG. 6 shows a fourth embodiment in which first and second reflectors of a cavity are variable pitch Bragg reflectors.

A fourth embodiment is described next with reference to FIG. 6, which shows an embodiment in which the first and second reflectors of the cavity 50 are variable pitch Bragg reflectors. This example is similar to that of FIG. 3, with the highly reflective rear face 13' replaced by a second Bragg reflector 40' on a waveguide 3" in the form of an optical fibre. An active portion 20 between the two reflectors 40, 40' has two faces, namely a face 13" referred to as the rear face and a front face 13, both having the lowest possible coefficient of reflection. The cavity 50 is therefore formed between the two Bragg reflectors 40, 40'.

In this embodiment the first reflector is a second Bragg reflector grating 40' carried by a second waveguide 3' and the first and second reflectors are on respective opposite sides of the semiconductor active portion 20.

Naturally one or both of the two fibres 3, 3" carrying the respective variable pitch reflector gratings 40, 40' could be replaced by a waveguide integrated into a semiconductor layer.

The operation of this embodiment is described below.

If the two reflectors 40, 40' are Bragg gratings having a continuous variation of the Bragg wavelength, and if the two gratings 40, 40' are symmetrical to each other with respect to a plane perpendicular to a longitudinal axis of the cavity, then equation (5) giving the value of $C_S$, repeated below:

$$C_S = d\lambda_B/dL_B = n_B\lambda_a/(n_aL_a + n_BL_1) \quad (5)$$

must be replaced by the equation:

$$C_S = d\lambda_B/dL_B = 2n_B\lambda_a/(n_aL_a + 2n_BL_1) \quad (6)$$

The condition of symmetry of the gratings is not obligatory. If the Bragg gratings constituting the first and second reflectors are not symmetrical, the sum of the reciprocal of the first parameter $C_{s1}$ of the first reflector and the reciprocal of the second parameter $C_{s2}$ of the second reflector is equal to the quotient of the optical distance between the closest together ends 41 and 41' of the two variable pitch gratings 40, 40' divided by the optical wavelength $n_B\lambda_a$ at the lower limit of the range of wavelengths in the waveguides 3 and 3". This is reflected in the following equation (7):

$$1/C_{s1} + 1/C_{s2} = (n_aL_a + n_B(L_1 + L_2))/n_B\lambda_a \quad (7)$$

In this equation, $L_1$ is the distance between the front face 13 and the beginning 41 of the grating 40 and $L_2$ is the distance between the rear face 13" and the beginning 41" of the grating 40'.

In equation (7), it is assumed that the optical indices $n_B$ of the waveguides carrying each of the gratings 40, 40' are equal. If these two indices are not equal, and are respectively equal to $n_{B1}$ and $n_{B2}$, then the optical distance between the closest together ends 41, 41' of the two gratings 40, 40' becomes $n_{B1}L_1 + n_{B2}L_2$.

From the examples described, it can be seen that there are many options for producing a Fabry-Pérot cavity of the invention resonating continuously between two optical frequency or wavelength values. The cavity can be formed in a single optical medium, i.e. a medium having a single refractive index value. It can also be produced by disposing in series a plurality of media each having its own refractive index. The junction faces between media together forming the cavity resonating over a continuous range are preferably treated so as not to reflect light. Cavities conforming to the invention are characterized by the fact that they all include a Bragg reflector grating having a continuous variation of the Bragg wavelength to enable continuous resonance from a first wavelength value to a second wavelength value. The variable pitch Bragg reflector grating constitutes a reflector of the cavity. The second reflector of the cavity can be a highly reflective face, as in the four embodiments described. It can instead take the form of a second Bragg reflector grating, and in particular a second Bragg reflector grating having a continuous variation of the Bragg wavelength.

Advantageous uses of continuously resonating Fabry-Pérot cavities of the invention are described next to illustrate the benefit of such cavities.

A first advantageous use relates to a resonant broadband semiconductor optical amplifier (SOA).

In this kind of amplifier, if the coefficient of reflection of one of the faces defining the optical cavity has a non-negligible value less than $10^{-3}$, the gain (the ratio of the output power to the input power) of the amplifier exhibits unwanted fluctuations as a function of wavelength. As a general rule, to avoid these unwanted fluctuations, the two faces defining the amplification medium are treated so that they are non-reflective. This eliminates the unwanted fluctuations, but the gain becomes that of a single-pass travelling wave amplifier.

An amplifier having a structure such as that described with reference to FIG. 1 of the accompanying drawings produces optical amplification over a wide band with no unwanted fluctuations and with a relatively high gain compared to prior art broadband amplifiers having no unwanted fluctuations.

This higher gain can be obtained over a wide band with an injected current that remains below the acceptable threshold for the amplifier structure.

A second advantageous use relates to a continuous emission spectrum light-emitting diode or laser.

If the optical gain provided by a current injected into a structure such as that described with reference to FIG. 1 is sufficient, the structure begins to lase and emits light if the threshold conditions are satisfied. Because the resonance condition is satisfied over a wide band with a cavity of the invention, the structure is able to emit a continuous spectrum if the gain spectrum of the active material is uniform within the band of resonant frequencies determined by the Bragg reflector grating. That instability results from strong interaction between the various frequency components is known in the art. It can be reduced or even rendered negligible by external injection of light. This injection causes mode locking over the wide frequency band determined by the Bragg reflector grating. It must be noted that mode locking is also produced continuously if the input frequency of the light varies.

A third use of a cavity of the invention relates to the production of a band-pass filter having steep flanks.

A passive cavity like that described with reference to FIG. 5, for example, can be used for this embodiment. If an incident wave is injected via the rear face 13', a filtered wave is obtained at the output of the Bragg grating 40. The transmission as a function of wavelength of this type of cavity is of the band-pass type and has steeper flanks than can be obtained with a simple Bragg grating filter, because of the effect of resonance of the cavity. For good rejection of spectral components outside the pass-band, the rear face 13' and the grating are advantageously designed to have a reflection coefficient close to 1 for the spectral components of that band.

A fourth use of a cavity of the invention relates to the production of a continuously tunable laser source. An active cavity such as one of those described with reference to FIG. 1 or FIG. 3, for example, can be used for this embodiment. To enable selection of the operating wavelength of said laser source, the active portion of the laser is electrically modulated at a modulation frequency whose period is equal to the round trip time of light between the rear face and a point on the variable pitch grating at which the light is reflected. Because of this, the laser operates at the Bragg wavelength at the point at which light is reflected. Thus varying the modulation frequency tunes the emission wavelength of the laser. Accordingly, the laser source can operate at any frequency from the minimum first frequency to the maximum second frequency. Note that the diode can also operate if the modulation frequency is an integer multiple of the frequency defined above. Thus the diode can also operate at a frequency in a continuous range of frequencies whose minimum frequency is an integer multiple of the first frequency and whose maximum frequency is the same integer multiple of the second frequency.

Appendix

List of Pertinent Prior Art Documents

[1] H. Ishii et al., "Super structure grating (SSG) for broadly tunable DBR lasers" IEEE Photonics Technology Letters, Vol. 4, pages 393–395, 1993.

What is claimed is:

1. A resonant optical cavity (50) having a first part provided with a first waveguide (3, 3') oriented along a longitudinal axis on which an origin of distances is defined, the cavity being defined between first and second reflectors (13', 40), the second of the reflectors being a variable pitch Bragg reflector grating (40) on said first waveguide (3, 3'), said grating (40) of the second reflector having one end (41) near the first reflector (13', 40') and one end farther away from the first reflector, and a parameter $C_S$ of variation of the Bragg wavelength defined as the derivative at a point on the reflector grating (40) of the Bragg wavelength $\lambda_B$ at that point with respect to the distance between that point and the origin having a given value, the optical cavity being characterized in that said value of the parameter $C_S$ and the position of said grating (40) relative to the origin are such that the cavity (50) formed between said first reflector (13', 40') and said second reflector (40) resonates continuously from a first optical frequency to a second optical frequency higher than the first optical frequency.

2. A resonant optical cavity (50) according to claim 1, characterized in that the value of said parameter $C_S$ is equal to the quotient of the optical wavelength $n_B \lambda_a$ in said first waveguide (3, 3'), which corresponds to said second frequency value, divided by the optical distance between said first reflector (13') and the end (41) of the grating (40) nearest the first reflector (13').

3. A resonant optical cavity (50) according to claim 1, characterized in that said cavity (50) has, in addition to the first part provided with the first waveguide (3, 3'), another part (4, 7) consisting of a semiconductor waveguide (4) optically aligned with said first part and optically coupled to the first waveguide.

4. A resonant optical cavity (50) according to claim 3, characterized in that said first reflector is a reflective face (13') at one end of said semiconductor waveguide (4).

5. A resonant optical cavity (50) according to claim 3, characterized in that the first reflector is a second Bragg reflector grating (40') carried by a second waveguide (3"), the first grating and the second grating (40, 40') being situated on respective opposite sides of said semiconductor waveguide.

6. A resonant optical cavity (50) according to claim 3, characterized in that the first waveguide (3') is also a semiconductor waveguide.

7. A resonant optical cavity (50) according to claim 3, characterized in that the first waveguide is an optical fibre (3).

8. Use of a resonant cavity (50) according to claim 3 to produce a semiconductor amplifier, said semiconductor waveguide (4) being an amplifier waveguide.

9. Use of a resonant cavity (50) according to claim 3 to produce a continuous emission spectrum light-emitting diode or laser, said semiconductor waveguide (4) being an amplifier waveguide.

10. Use of a resonant cavity (50) according to claim 3 to produce a laser source tunable to any frequency in the continuous range of frequencies of said cavity or to a frequency in a continuous range of frequencies whose minimum frequency is an integer multiple of the first frequency and whose maximum frequency is the same integer multiple of the second frequency, said semiconductor waveguide (4) being an amplifier waveguide.

11. A resonant optical cavity (50) according to claim 1, characterized in that the first reflector (13', 40') is on the first waveguide (3, 3') that carries said Bragg reflector grating (40) forming the second reflector.

12. A resonant optical cavity (50) according to claim 11, characterized in that the first reflector is a reflective face (13').

13. Use of a resonant cavity (50) according to claim 11 to produce a band-pass filter.

14. A resonant optical cavity (50) according to claim 1, characterized in that the first reflector is also a variable pitch Bragg reflector grating (40').

15. Use of a resonant cavity (50) according to claim 1 to produce a band-pass filter.

* * * * *